(12) United States Patent
Yoshida et al.

(10) Patent No.: US 11,553,586 B2
(45) Date of Patent: Jan. 10, 2023

(54) WIRING SUBSTRATE AND ELECTRONIC DEVICE

(71) Applicant: CANON KABUSHIKI KAISHA, Tokyo (JP)

(72) Inventors: Toshiyuki Yoshida, Kanagawa (JP); Yu Ogawa, Tokyo (JP); Shoji Matsumoto, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/112,465

(22) Filed: Dec. 4, 2020

(65) Prior Publication Data

US 2021/0185798 A1 Jun. 17, 2021

(30) Foreign Application Priority Data

Dec. 12, 2019 (JP) .............................. JP2019-224921

(51) Int. Cl.
*H05K 1/02* (2006.01)
*H05K 1/11* (2006.01)
*H05K 1/18* (2006.01)
*H01L 27/146* (2006.01)

(52) U.S. Cl.
CPC ..... *H05K 1/0224* (2013.01); *H01L 27/14636* (2013.01); *H05K 1/0298* (2013.01); *H05K 1/0225* (2013.01); *H05K 1/0237* (2013.01); *H05K 1/11* (2013.01); *H05K 1/18* (2013.01)

(58) Field of Classification Search
CPC .. H05K 1/0224; H05K 1/0298; H05K 1/0353; H05K 1/148; H05K 2201/0141; H05K 2201/0145; H05K 2201/0154; H05K 2201/09236; H05K 2201/09681; H05K 1/0225; H05K 1/0237; H05K 1/0219; H01L 27/14636; H01L 27/14625; H01L 27/14618
See application file for complete search history.

(56) References Cited

U.S. PATENT DOCUMENTS 7,504,904 B1* 3/2009 Powers .................. H01P 3/081
  333/33
8,248,183 B2* 8/2012 Syal ........................ H01P 5/028
  333/33

(Continued)

FOREIGN PATENT DOCUMENTS

JP 2000-077802 A 3/2000

*Primary Examiner* — Ishwarbhai B Patel
(74) *Attorney, Agent, or Firm* — Canon U.S.A., Inc., IP Division (57) ABSTRACT

A wiring substrate which includes a base member having a first surface, a first differential signal line disposed on the first surface of the base member and a second differential signal line disposed adjacent to the first differential signal line on the first surface of the base member. A ground layer which faces the first and second differential signal lines, has a plurality of openings continuously arranged along a predetermined direction. In a planar view of the wiring substrate, where a length of each of the plurality of openings in a direction along the signal lines is a length L1, a length of the opening in a direction orthogonal to Li is a length L2, and a distance between the first and second differential signal lines is a length L3, L1 is equal to or greater than four times L2, and L2 is equal to or less than L3.

19 Claims, 8 Drawing Sheets

(56) References Cited

U.S. PATENT DOCUMENTS

2011/0279189 A1* 11/2011 Umeda ................ H05K 1/0245
333/5
2013/0313013 A1* 11/2013 Porta .................... H05K 1/0225
174/268

* cited by examiner

WIRING SUBSTRATE AND ELECTRONIC DEVICE

BACKGROUND

Field of the Disclosure

The present disclosure generally relates to a wiring substrate that is used for an electronic device, and particularly relates to a technique for reducing noise generated from the wiring substrate.

Description of the Related Art

Two semiconductor devices in an electronic device perform data communication with each other using digital signals. Digital signals in the data communication are generally transmitted via a differential signal line. Radiation noise generated by the differential signal line and crosstalk noise generated between the differential signal lines may lead to deterioration of digital signal quality and a malfunction of the semiconductor devices. Japanese Patent Laid-Open No. 2000-077802 discusses a wiring substrate including a shield having a predetermined opening pattern for reducing radiation noise generated by a differential signal line.

SUMMARY

One of aspects of the present disclosure provides a wiring substrate comprising: a base member having a first surface; a first differential signal line including a first pair of signal lines disposed on the first surface of the base member; a second differential signal line including a second pair of signal lines disposed adjacent to the first differential signal line on the first surface of the base member; and a ground layer facing the first differential signal line and the second differential signal line and having an opening portion including a plurality of openings continuously arranged along a predetermined direction, wherein in a planar view of the wiring substrate, where a length of each of the plurality of openings in a direction along the signal lines is a length L1, a length of the opening in a direction orthogonal to a length direction of the length L1 is a length L2, and a distance between the first differential signal line and the second differential signal line is a length L3, the length L1 is equal to or greater than four times the length L2, and the length L2 is equal to or less than the length L3.

Further features of the present disclosure will become apparent from the following description of exemplary embodiments with reference to the attached drawings.

DESCRIPTION OF THE EMBODIMENTS

Various exemplary embodiments of the present disclosure will be described in detail below with reference to the attached drawings.

First Exemplary Embodiment

Figure 1:
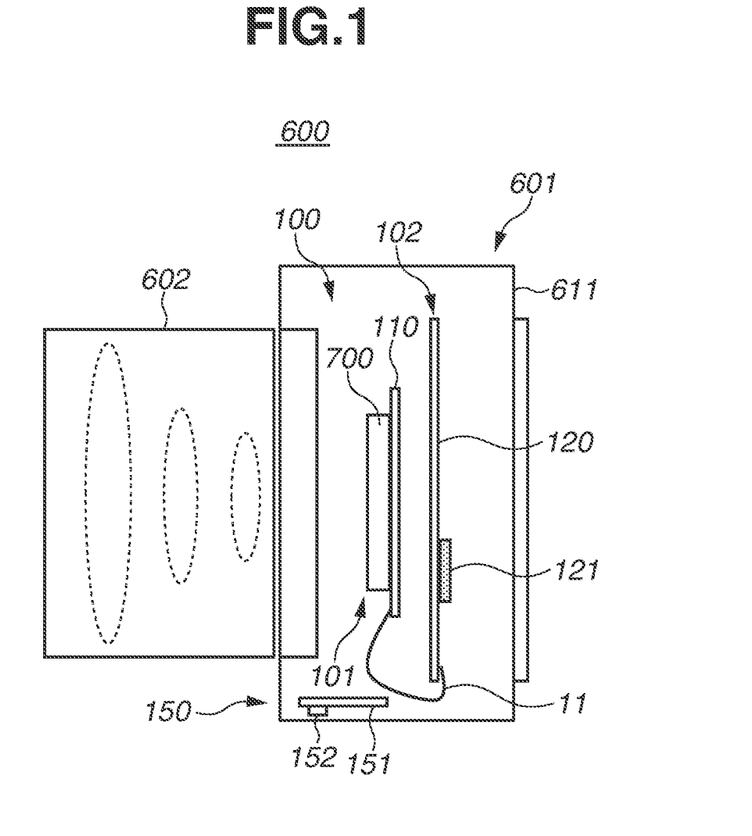
FIG. 1 is a schematic drawing of an image capturing apparatus as an example of an electronic device according to a first exemplary embodiment.

FIG. 1 is an explanatory diagram illustrating a digital camera 600 which is an image capturing apparatus as an example of an electronic device according to a first exemplary embodiment. The digital camera 600 as the image capturing apparatus is a lens interchangeable type digital camera and includes a camera body 601. A lens unit (a lens barrel) 602 including a lens can be detached from the camera body 601. The camera body 601 includes a housing 611 and an image capturing unit 100 and a wireless communication unit 150 stored in the housing 611.

The image capturing unit 100 includes a first printed circuit board 101, a second printed circuit board 102, and a flexible wiring board 11 as a wiring substrate (wiring board) which electrically connects the first printed circuit board 101 and the second printed circuit board 102. The flexible wiring board 11 contributes to the weight reduction of a wiring structure as compared with a coaxial cable.

The first printed circuit board 101 includes a first printed wiring board 110 and a first semiconductor device 111 disposed on the first printed wiring board 110. The second printed circuit board 102 includes a second printed wiring board 120 and a second semiconductor device 121 disposed on the second printed wiring board 120.

The first semiconductor device 111 is an image sensor as an image capturing element. The image sensor is, for example, a complementary metal oxide semiconductor (CMOS) image sensor or a charge coupled device (CCD) image sensor. The image sensor has a function of converting incident light via the lens unit 602 into an electrical signal. The second semiconductor device 121 is a digital signal processor as a processing circuit. The digital signal processor has a function of obtaining an electrical signal indicating image data from the image sensor, correcting the obtained electrical signal, and generating corrected image data.

The wireless communication unit 150 which performs wireless communication in a GHz band is a modularized wireless communication module. The wireless communication unit 150 includes a third printed wiring board 151 provided with an antenna (not illustrated) and a wireless communication integrated circuit (IC) 152 disposed on the third printed wiring board 151. The antenna is disposed on a same plane where the wireless communication IC 152 is disposed and is arranged at a position near the housing 611, to easily communicate with the outside. The wireless communication IC 152 transmits and receives image data by wireless communication with an external device (such as a personal computer (PC), a wireless router, and the like) via the antenna. In other words, the wireless communication IC 152 modulates a digital signal indicating image data and transmits the modulated signal from the antenna as a radio wave having a communication frequency of a wireless communication standard. Further, the wireless communication IC 152 demodulates a radio wave received by the antenna into a digital signal indicating image data. The wireless communication IC 152 wirelessly communicates with an external device in conformity with standards such as WiFi® and Bluetooth®.

Figure 2A:
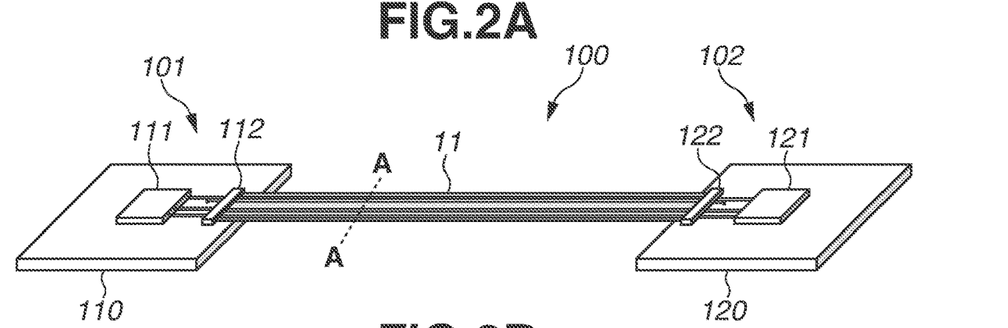
FIG. 2A is an explanatory diagram illustrating an image capturing unit according to the first exemplary embodiment.
Figure 2B:
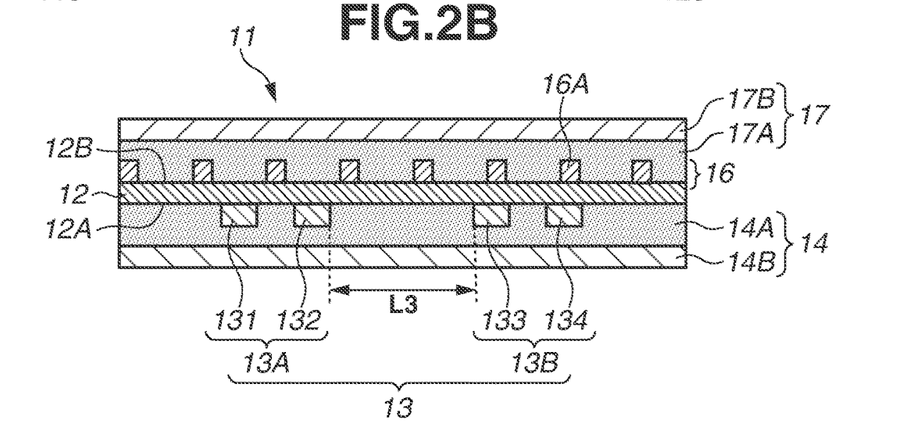
FIG. 2B is a cross-sectional view of a flexible wiring board according to the first exemplary embodiment.
Figure 2C:
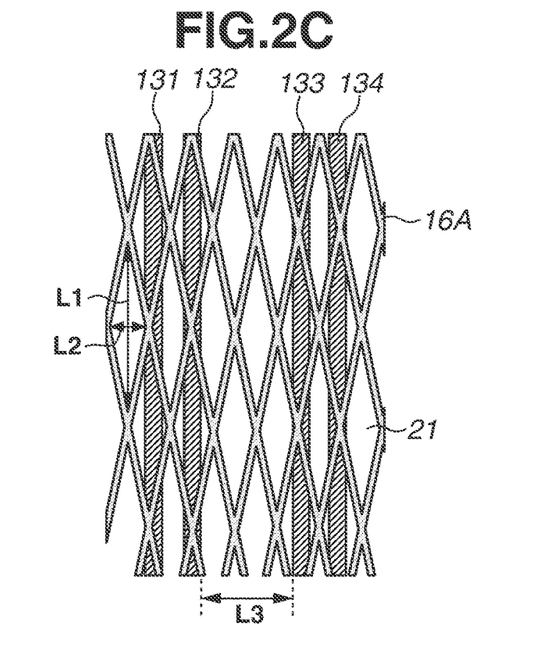
FIG. 2C is an explanatory diagram illustrating a positional relationship of a ground layer and differential signal lines according to the first exemplary embodiment.

FIG. 2A is an explanatory diagram illustrating the image capturing unit 100. FIG. 2B is a cross-sectional view of the flexible wiring board 11 taken along a line A-A in FIG. 2A. FIG. 2C is an explanatory diagram illustrating a positional relationship between a ground layer and differential signal lines, in a planar view of the flexible wiring board 11 from a first surface 12A of a base member 12.

As illustrated in FIG. 2A, a connector 112 is disposed on the first printed wiring board 110. The connector 112 is electrically connected to the first semiconductor device 111 by a conductor disposed on the first printed wiring board 110. A connector 122 is disposed on the second printed wiring board 120. The connector 122 is electrically connected to the second semiconductor device 121 by a conductor disposed on the second printed wiring board 120. In other words, the first semiconductor device 111 and the second semiconductor device 121 are electrically connected to each other by the first printed wiring board 110, the flexible wiring board 11, and the second printed wiring board 120 and can communicate with each other.

As illustrated in FIG. 2B, the base member 12 has the first surface 12A on one side of the base member 12 and a second surface 12B on the other side opposite to the first surface 12A in the flexible wiring board 11.

A wiring layer 13 is disposed on the first surface 12A. The wiring layer 13 includes a first differential signal line 13A having a pair of signal lines including a first signal line 131 and a second signal line 132 and a second differential signal line 13B having a pair of signal lines including a third signal line 133 and a fourth signal line 134. A distance between the second signal line 132 of the first differential signal line 13A and the third signal line 133 of the second differential signal line 13B is a length L3.

Over the second surface 12B, a ground layer 16 having an opening portion 21 including a plurality of openings is disposed. The ground layer 16 has the opening portion 21 and a non-opening portion 16A where an opening is not formed.

In a case where the wiring substrate is a flexible wiring board, a material of the base member 12 is a resin. Examples of the resin include a polyimide-based resin, such as polyimide, polyamide, and polyamide-imide resins, a thermosetting resin, such as an epoxy resin, and a thermoplastic resin, such as a liquid crystal polymer resin. Among these materials, polyimide or a liquid crystal polymer is desirable. Polyimide has excellent heat resistance and mechanical properties and is easily commercially available. A liquid crystal polymer has a low relative permittivity and thus is suitable for an application for transmitting a high-speed signal and also has low hygroscopicity and excellent dimensional stability. A thickness of the base member 12 is not particularly limited, but is desirably in a range of 10 μm or more and 100 μm or less. If the thickness is less than 10 μm, a distance between the first differential signal line 13A and the ground layer 16 is short, and thus a characteristic impedance value may increase. Meanwhile, if the thickness exceeds 100 μm, rigidity of the resin is increased, and thus flexibility thereof may be insufficient. The thickness of the base member 12 is more desirably in a range of 12 μm or more and 75 μm or less.

In a case where the wiring substrate is a rigid substrate, the material of the base member 12 is a fiber base member. Examples of the fiber base member include a glass fiber base member, such as a glass woven fabric and a glass non-woven fabric, and an inorganic fiber base member, such as a woven fabric or a non-woven fabric including an inorganic compound other than glass as a component. The examples thereof further include an organic fiber base member including an organic fiber, such as aromatic polyamide, polyamide, aromatic polyester, polyester, polyimide, and fluororesin. Among these materials, a glass fiber base member is desirable in terms of excellent strength and low water absorption.

The wiring layer 13 includes the first differential signal line 13A and the second differential signal line 13B which are transmission paths of differential signals. A data signal which is a digital signal indicating image data is transmitted via the first differential signal line 13A and the second differential signal line 13B. The wiring layer 13 may include a line for transmitting a single-ended signal, such as a control signal and a response signal, and a line for grounding in addition to the differential signal lines.

A manufacturing method of the wiring layer 13 is not particularly limited, and the wiring layer 13 may be formed by a known method, such as lamination of a metallic foil, metallic plating, and an ink jet process. In a case where a copper foil is used as a metallic foil, a transmission line pattern can be formed by a photolithography and etching process using films stacked together by an adhesive and the like. In a case where the ink jet process is used, a necessary pattern is drawn using polymer ink including conductive metal particles, and the pattern can be formed by being fired at a temperature of a glass transition point (Tg) of the base member 12 or less. A thickness of the wiring layer (a thickness of a differential signal line) is not particularly limited, but is in a range of, for example, 0.1 μm or more and 20 μm or less.

If average lengths of a positive-phase signal and a negative-phase signal transmitted via the differential signal line are different, a part of a differential signal is converted into a common mode signal, also known as mode conversion, occurs and common mode noise is induced. If the common mode noise resonates on the wiring substrate, large radiation noise is generated at a frequency of the common mode noise. In addition, with an increase of amounts of communication data in recent years, a differential signal having a high transmission speed in gigabits per second (Gbps) order, such as 5 Gbps or more, is transmitted via the differential signal line. A relationship of R=2f is satisfied between a signal transmission speed R [bps] and a signal frequency f [Hz]. Generally, a temporal change amount of a current flowing through a transmission line increases with increase in a frequency of a transmitted differential signal, and thus more radiation noise is generated. The generated radiation noise has a frequency close to a communication frequency band of a wireless communication apparatus, and consequently the radiation noise may be superimposed on communication data during wireless communication between the wireless communication IC and an external device (a PC, a wireless router, or the like) via the antenna.

It is conventionally known that, in a wiring substrate in which conductor layers are stacked over a base member, a transmission line is disposed using the conductor layer over one surface of the base member as a wiring layer, and the other conductor layer disposed over another surface is used as a ground layer (a shield layer) for suppressing radiation noise. It is also known that a ground layer having openings in a mesh pattern as discussed in Japanese Patent Laid-Open No. 2000-077802 is used. However, as a result of examination by the inventors of the present application, it has been found that the technique discussed in Japanese Patent Laid-Open No. 2000-077802 cannot sufficiently suppress radiation noise in a case where a high-speed differential signal is transmitted. Further, it has been found that the technique discussed in Japanese Patent Laid-Open No. 2000-077802 cannot sufficiently suppress crosstalk noise generated between differential signal lines adjacent each other.

Therefore, according to the present exemplary embodiment, the ground layer 16 in the flexible wiring board 11 has the opening portion 21 including a plurality of openings continuously arranged along a predetermined direction. In other words, the plurality of openings is arranged at predetermined intervals. A size of the opening of the opening portion 21 can be expressed using lengths L1, L2, and L3 described below and is characterized in that the length L1 is four times or more of the length L2, and the length L2 is the length L3 or less. The length L1 is a maximum length of the opening in a direction along a longitudinal direction of the signal lines 131, 132, 133, and 134, in a planar view of the flexible wiring board 11. The length L2 is a maximum length of the opening in a direction orthogonal to a length direction of the length L1. The length L3 is a distance between the first differential signal line 13A and the second differential signal line 13B. FIG. 2C illustrates a relationship of the lengths L1, L2, and L3 according to the first exemplary embodiment. It can be seen from FIG. 2C that the ground layer 16 includes the opening portion 21 including a plurality of openings, and shapes of the openings are two-dimensionally continuously patterned. The predetermined direction is, for example, a direction in which the signal line is installed.

The length L1 having a length of four times or more of the length L2 means that a length of the opening in a signal transmission direction is sufficiently long with respect to the length of the opening in an orthogonal direction. Further, the length L1 having such a length also means that an aspect ratio of the opening is large, and the opening has a highly anisotropic shape. Since the ground layer 16 has the above-described configuration, return routes of the first differential signal line 13A and the second differential signal line 13B can be shortened. Inductance of the return route is reduced with decrease in the return route, and consequently, the radiation noise generated from the first differential signal line 13A and the second differential signal line 13B can be reduced as compared with a configuration in which the length L1 is less than four times of the length L2. Further, the non-opening portion 16A of the ground layer 16 can be arranged closer to the first differential signal line 13A and the second differential signal line 13B. The non-opening portion 16A arranged closer to the first differential signal line 13A and the second differential signal line 13B causes mutual inductance of both the first differential signal line 13A and the second differential signal line 13B to be increased, so that the radiation noise can be reduced even if a high-speed signal is transmitted.

It is desirable that the length L1 is 1.5 mm or less. If the length L1 is longer than 1.5 mm, a ratio of the opening portion (an opening ratio) in the ground layer becomes too large, a shielding effect on the radiation noise is reduced, and there is a possibility of affecting a wireless communication apparatus in the electronic device. It is more desirable that the length L1 is 1.2 mm or less.

In addition, the length L2 having a length of the length L3 or less means that at most only one differential signal line is arranged for one opening. The ground layer 16 has the above-described configuration, and thus the non-opening portion 16A is interposed between the first differential signal line 13A and the second differential signal line 13B, and consequently crosstalk noise can be reduced as compared with a case in which the length L2 is less than the length L3.

The lengths L1, L2, and L3 satisfy the above-described relationship, and thus the wiring substrate according to the present exemplary embodiment can suppress both the radiation noise generated from the differential signal lines and the crosstalk noise generated between two adjacent differential signal lines even in a case where a high-speed differential signal at the Gbps order is transmitted.

It is desirable that a thickness of the ground layer 16 (the non-opening portion 16A) is in a range of 1 μm or more and 20 μm or less. If the thickness is less than 1 μm, a resistance value of the ground layer 16 (the non-opening portion 16A) becomes large. Therefore, a return current becomes difficult to flow in a case where common mode noise is generated, and consequently a radiation noise amount may be increased. Meanwhile, if the thickness of the ground layer 16 is more than 20 μm, it becomes difficult to smoothen a surface shape of a second insulating layer 17. It is more desirable that the thickness of the ground layer 16 is in a range of 2 μm or more and 15 μm or less.

The opening ratio which is an area ratio of the opening portion 21 to the ground layer 16 is desirably in a range of 40% or more and 90% or less. In other words, the opening ratio is a ratio of an area of the opening portion 21 to a total area of the non-opening portion 16A and the opening portion 21. It is more desirable that the opening ratio is in a range of 50% or more and 85% or less.

If the opening ratio is less than 40%, the characteristic impedance value is lowered, and a transmission characteristic may be deteriorated depending on a speed of a transmitted signal. In addition, rigidity of the ground layer 16 is increased, and if the wiring substrate is the flexible wiring board 11, the flexibility may be insufficient. Meanwhile, if the opening ratio is greater than 90%, the radiation noise can be sufficiently suppressed, and communication of the wireless communication apparatus may be affected.

The opening ratio can be measured by, for example, the following method. An image of the ground layer 16 is captured by a laser microscope or a scanning electron microscope (SEM) from a direction perpendicular to the second surface 12B of the base member 12. The image to be captured should include ten openings or more. Portions corresponding to the opening portion 21 and the non-opening portion 16A are binarized using the captured rectangular image, and by using the number of pixels, respective areas of the opening portion 21 and the non-opening portion 16A are calculated. The respective areas of the opening portion 21 and the non-opening portion 16A can be calculated using the following formula.

$$\text{Opening ratio (\%)} = \frac{\left(\begin{array}{c}\text{Opening area in a rectangular}\\\text{area including 10 openings or more}\end{array}\right)}{\left(\begin{array}{c}\text{Rectangular area including}\\\text{10 openings or more}\end{array}\right)} * 100$$

A size of an image to be captured in this operation is desirably 500 pixels*500 pixels or more. The above-described lengths L1 and L2 can be also calculated using the above-described image. The lengths L1 and L2 are calculated by binarizing and separating the opening portion and the non-opening portion, measuring pixel lengths, and averaging values of the lengths L1 and L2 of ten openings.

Figure 3A:
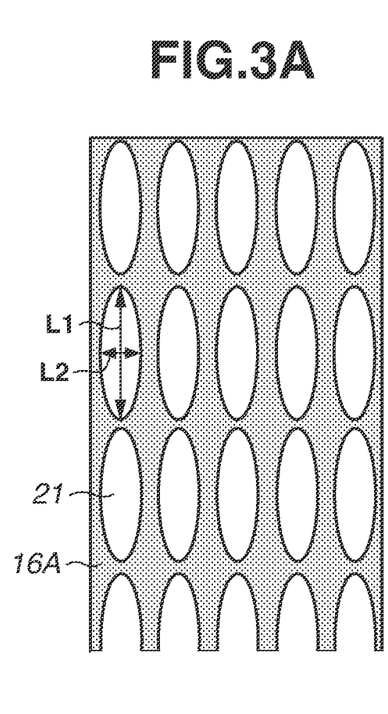
FIGS. 3A, 3B, and 3C are explanatory diagrams illustrating shapes of opening portions on a ground layer.
Figure 3B:
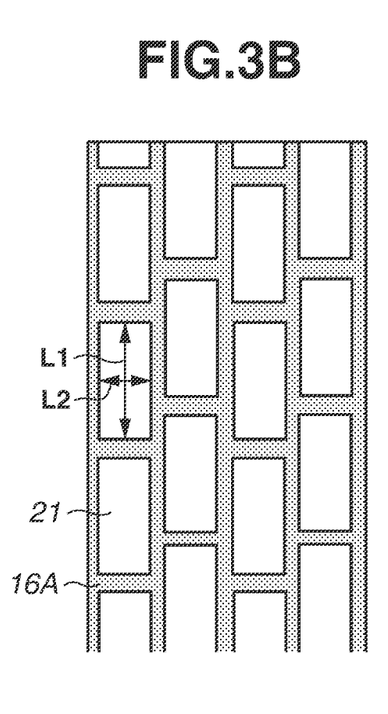
Figure 3C:
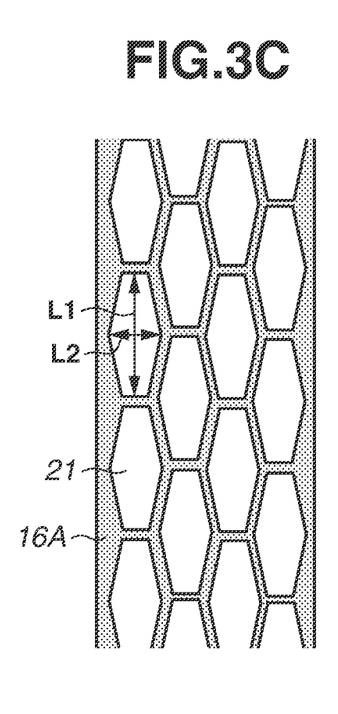

A shape of the opening portion 21 is not particularly limited as long as the relationship of the lengths L1, L2, and L3 is satisfied. The shape of the opening portion 21 may be a rhombus as illustrated in FIG. 2C, or an ellipse, a rectangle, and a hexagon as illustrated in FIGS. 3A to 3C. In addition, the shape of the opening portion 21 may include a plurality of shapes selected from the above-described shapes. Among these shapes, polygons such as a quadrangle and a hexagon are desirable. If the shape of the opening portion 21 is polygonal, a variation in a width of the non-opening portion can be prevented or reduced, and therefore since the return route of the radiation noise becomes uniform, the radiation noise can be suppressed more efficiently.

A method for forming the ground layer 16 is not particularly limited. For example, the method for forming the ground layer 16 over the base member 12 may be a subtractive method, an electroless plating method, an electrolytic plating method, and a physical vapor deposition method such as vacuum vapor deposition and a sputtering method. In addition, a method for bonding conductive fibers and a screen printing method can be adopted. A procedure for forming the ground layer 16 by plating is described below. First, a metal layer is disposed over the base member by metal vapor deposition. A metal for forming the metal layer includes copper, aluminum, nickel, iron, gold, silver, platinum, tungsten, chromium, titanium, tin, lead, and palladium, and one or more of them may be combined. Among these metals, silver, copper, or nickel is desirable in terms of conductivity and low cost. Next, a mesh-shaped resist layer is disposed over the metal layer. In this case, a resist layer is formed using a printing method by intaglio printing, the metal layer is etched and removed using the resist layer as a mask, and then the resist layer is removed. Accordingly, a mesh-shaped structure made from the metal layer as the ground layer including the opening portion is formed.

It is desirable that a distance between the wireless communication unit 150 and the ground layer 16 is shorter than a distance between the wireless communication unit 150 and the wiring layer 13 in the housing 611 of the electronic device. In other words, it is desirable that the ground layer 16 is disposed at a position closer to the wireless communication unit 150 than the wiring layer 13. Since the ground layer 16 is closer to the wireless communication unit 150 than the wiring layer 13, the radiation noise generated from the wiring layer 13 can be prevented from being superimposed on a radio wave used for external communication performed by the wireless communication unit 150.

A first insulating layer 14 is disposed over the wiring layer 13 of the flexible wiring board 11. The first insulating layer 14 includes a first adhesive portion 14A and a first covering portion 14B. The wiring layer 13, the first adhesive portion 14A, and the first covering portion 14B are stacked in this order.

The second insulating layer 17 is disposed over the ground layer 16 of the flexible wiring board 11. The second insulating layer 17 includes a second adhesive portion 17A and a second covering portion 17B. The wiring layer 13, the second adhesive portion 17A, and the second covering portion 17B are stacked in this order.

It is desirable that the first adhesive portion 14A and the second adhesive portion 17A have high electrical insulation properties. A cured product of a known adhesive can be used as the first adhesive portion 14A and the second adhesive portion 17A. For example, an acrylonitrile-butadiene rubber (NBR) based adhesive, a polyamide-based adhesive, a polyester-based adhesive, an acrylic-based adhesive, a polyester polyurethane-based adhesive, and a silicone-based adhesive can be used.

While thicknesses of the first adhesive portion 14A and the second adhesive portion 17A are not particularly limited, it is desirable that a transmission line is sufficiently covered and the surfaces of the portions are smooth. Specifically, the thicknesses of the first adhesive portion 14A and the second adhesive portion 17A are desirably in a range of 2 μm or more and 50 μm or less and are particularly desirably in a range of 5 μm or more and 30 μm or less. If the thicknesses of the first adhesive portion 14A and the second adhesive portion 17A are less than 2 μm, filling between lines is insufficient, which may cause peeling and the like in a case where the first covering portion 14B and the second covering portion 17B is bonded. Further, if the thicknesses of the first adhesive portion 14A and the second adhesive portion 17A exceed 50 μm, an amount of the adhesive seeping from the portions may increase.

A method for forming the first adhesive portion 14A and the second adhesive portion 17A is not particularly limited and may be a method for stacking and curing a sheet type adhesive, a method for applying a liquid adhesive by a dispenser or a printing method and curing the applied adhesive by heat or ultraviolet irradiation, and the like.

The first covering portion 14B and the second covering portion 17B serve as protective layers for suppressing energization to other components in the electronic device. Therefore, the first covering portion 14B and the second covering portion 17B have insulation properties and are made of resins including a flexible cover film and a coating layer of an insulating resin. As the cover film, engineering plastic can be used. For example, polypropylene, cross-linked polyethylene, polyester, polybenzimidazole, polyamide, polyimide, polyimidoamide, polyetherimide, polyphenylene sulfide (PPS), polyethylene naphthalate (PEN), and poly ether ketone (PEEK) can be used. A polyester film is desirable in terms of low cost. In terms of excellent in flame retardancy, it is desirable to use a polyphenylene sulfide film, and in a case where heat resistance is further required, it is desirable to use an aramid film and a polyimide film.

The insulating resin may be any resin having an insulation property and can include, for example, a thermosetting resin or an ultraviolet curable resin. The thermosetting resin may include a phenol resin, an acrylic resin, an epoxy resin, a melamine resin, a silicone resin, and an acrylic modified silicone resin. The ultraviolet curable resin may include an epoxy acrylate resin, a polyester acrylate resin, and a methacrylate modified material thereof. A curing form may be any of heat curing, ultraviolet curing, electron beam curing, and the like. Further, other known additives, such as a color pigment, a flame retardant, an antioxidant, a lubricant, an anti-dusting agent, and a curing accelerator may be blended if necessary.

A method for forming the first covering portion 14B and the second covering portion 17B is not particularly limited, and a known method can be used for coating of the insulating resin. A solution prepared by dissolving an insulating resin in a solvent can be applied by a gravure coating method, a kiss coating method, a die coating method, a blade method, a roll coating method, a knife coating method, a spray coating method, a bar coating method, a spin coating method, and a dip coating method. The solvent can be appropriately selected according to a type of resin to be used. For example, a ketone-based solvent, such as acetone, methyl ethyl ketone, and cyclohexanone, and an alcohol-based solvent such as methanol, ethanol, propanol, ethylene glycol, glycerin, and propylene glycol monomethyl ether can be used. Further, an acid, such as acetic acid, an amide-based solvent, such as formamide, dimethyl acetamide, and N-methylpyrrolidone, a nitrile-based solvent, such as acetonitrile and propionitrile, and an ester-based solvent, such as methyl acetate and ethyl acetate can be used. Furthermore, a carbonate-based solvent, such as dimethyl carbonate and diethyl carbonate can be used. In a coating process, a heating or drying process may be included to volatilize the solvent, if necessary. For heating and drying, a known heating and drying apparatus, such as a hot air drying machine and an infrared heater, can be used, and a temperature and a time of heating and drying can be appropriately selected.

Thicknesses of the first covering portion 14B and the second covering portion 17B are not particularly limited, but are desirably in a range of 5 μm or more and 50 μm or less and are particularly desirably in a range of 10 μm or more and 30 μm or less. If the thicknesses of the first covering portion 14B and the second covering portion 17B are less than 5 μm, strength thereof may be insufficient. Meanwhile, if the thicknesses of the first covering portion 14B and the second covering portion 17B exceed 50 μm, slidability and flexibility thereof may be lowered. Further, volume resistance values of the first covering portion 14B and the second covering portion 17B are desirably $10^9$ Ω·cm or more and are more desirably $10^{13}$ Ω·cm or more.

In a case where the first covering portion 14B and the second covering portion 17B have a function of adhering to the base member 12 and the wiring layer 13, the first adhesive portion 14A and the second adhesive portion 17A are not necessary.

(Modification)

Figure 4:
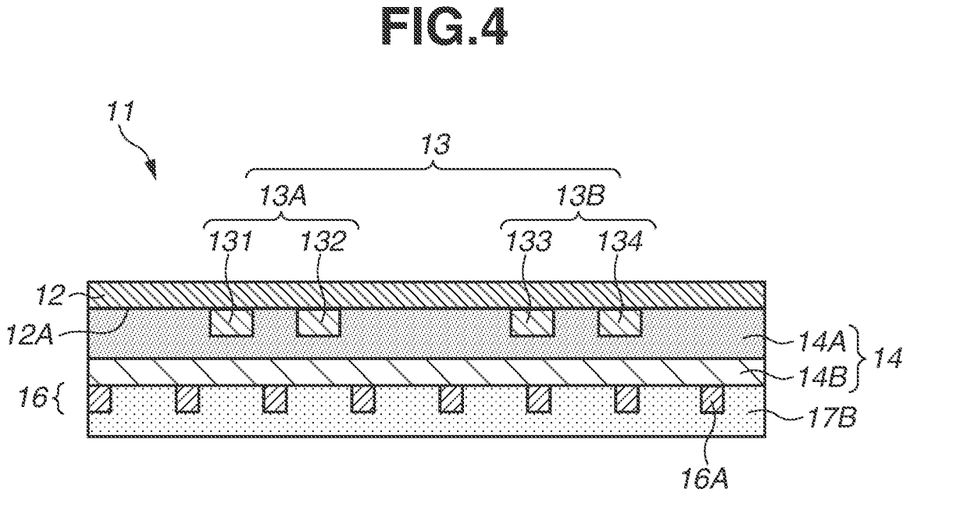
FIG. 4 is a cross-sectional view of a flexible wiring board according to a modification.

According to the present exemplary embodiment, the ground layer 16 is disposed on the first surface 12A of the base member 12. However, the position of the ground layer 16 is not limited to the above-described configuration. As long as the ground layer 16 faces the wiring layer 13, the ground layer 16 may be disposed over, for example, the first insulating layer 14 disposed over the wiring layer 13 as illustrated in FIG. 4. In the modification, the second covering portion 17B formed over the ground layer 16 has an adhering function.

EXAMPLE

Next, the present disclosure is described in more detail with reference to examples and comparative examples, but is not limited to the below-described examples. A measurement method according to the present disclosure is as follows.

An evaluation method of wiring substrates according to the examples and the comparative examples is described below.

(1) Radiation Noise Measurement

Figure 5:
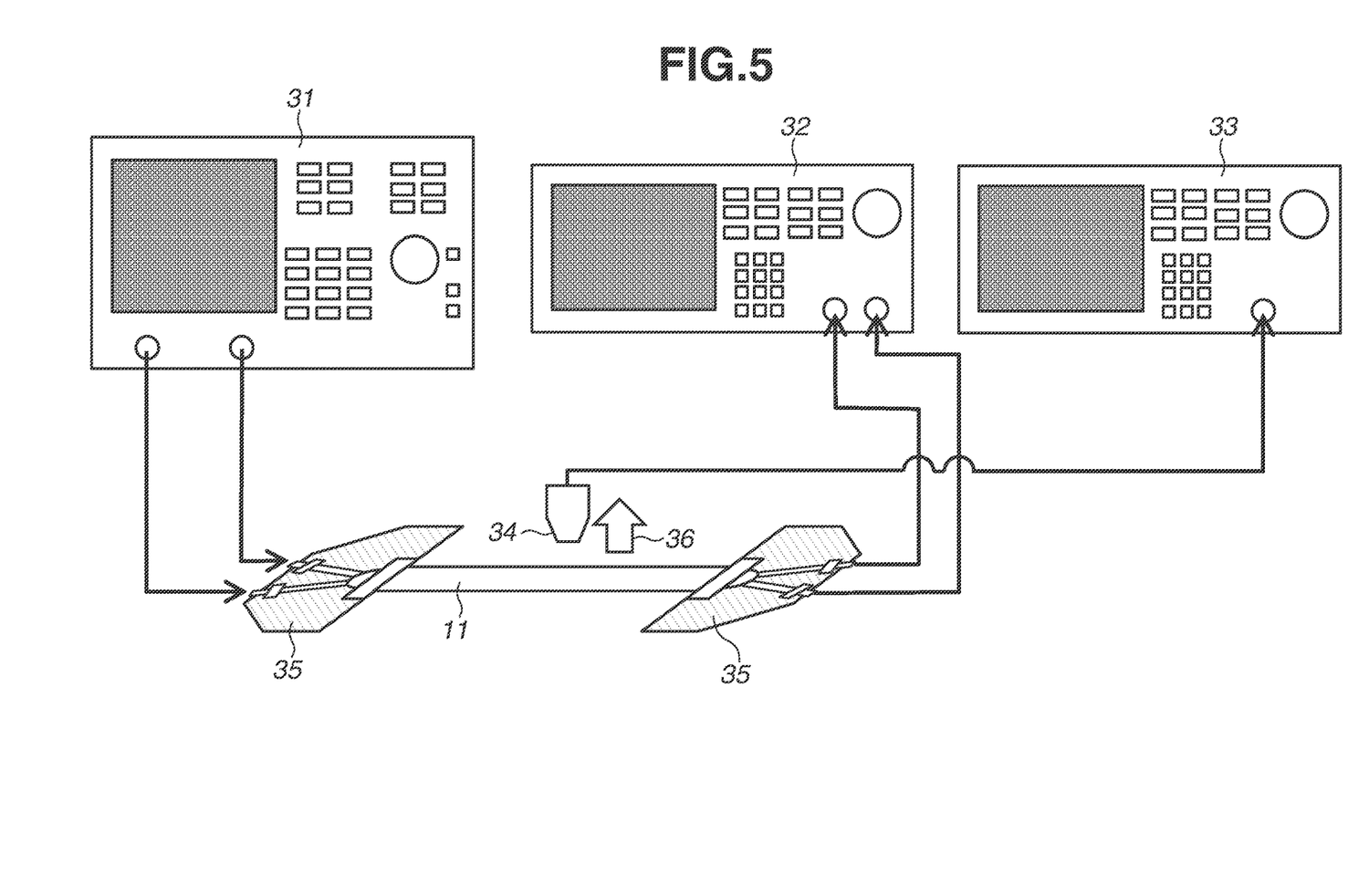
FIG. 5 is a diagram illustrating a system used for measurement of radiation noise according to examples.

A radiation noise amount of the flexible wiring board 11 as the wiring substrate was evaluated using a system including a configuration illustrated in FIG. 5.

First, a differential wiring substrate was prepared for measuring a radiation noise amount of a wiring substrate without a ground layer as a reference. A copper foil having a thickness of 12 μm was stacked as a wiring layer over one surface of a base member of a polyimide film (Kapton® 100H manufactured by DU PONT-TORAY CO., LTD.) having a thickness of 25 μm. Then, a differential transmission line having a line width of 140 μm, a line interval of 55 μm, and a total length of 120 mm was formed on the wiring layer by an etching method.

Next, a polyimide film having a thickness of 12.5 μm and a coverlay (CISV1215 manufactured by NIKKAN INDUSTRIES CO., LTD.) having a thickness of 15 μm were stacked over the wiring layer, and thus the differential wiring substrate without the ground layer for the reference was obtained.

Next, the wiring substrate was connected to a connection substrate 35. A signal generator 31 (M8041A manufactured by Keysight Technologies) was used to transmit a signal having a data pattern of a bit rate of 5.3 Gbps as a pseudo-random binary sequence (PRBS) 23. Then, a waveform of a common mode voltage was observed using an oscilloscope 32 (92504A manufactured by Agilent Technologies Japan, Ltd.), and an input amplitude was adjusted so that the common mode voltage became 150 mV.

Next, the flexible wiring board 11 (of the examples and the comparative examples) as a measurement target was connected to the connection substrate 35, and the signal generator 31 transmitted the signal having the data pattern of the bit rate of 5.3 Gbps as PRBS 23. Here, the signal was transmitted with the input amplitude adjusted using the differential wiring substrate without the ground layer for the reference. Radiation noise 36 at 5 GHz generated from the flexible wiring board 11 was detected by a pen type electric near field probe 34 (manufactured by Electro-Metrics) having a length of 110 mm and measured by a spectrum analyzer 33 (E4440A manufactured by Keysight Technologies). The radiation noise amount was measured as follows. The electric near field probe 34 was installed at a height of 5 mm from the wiring substrate, and each point was scanned five times. Then, an average value calculated from values obtained by scanning all points in an area where the ground layer was formed at 1 mm intervals by the electric near field probe 34 was taken as the radiation noise amount. A smaller amount of the radiation noise means that the radiation noise can be successfully shielded, and the wiring substrate has a better shielding property. The radiation noise was measured in an atmosphere having a temperature of 25° C. and a relative humidity of 23 to 50% in a frequency range from 300 kHz to 20 GHz. Evaluation criteria were as follows, and a rank B or higher was accepted.

A: less than 20 dBμV
B: 20 dBμV or more and less than 25 dBμV
C: 25 dBμV or more (2) Transmission Characteristic Evaluation (Eye Pattern)

Figure 6:
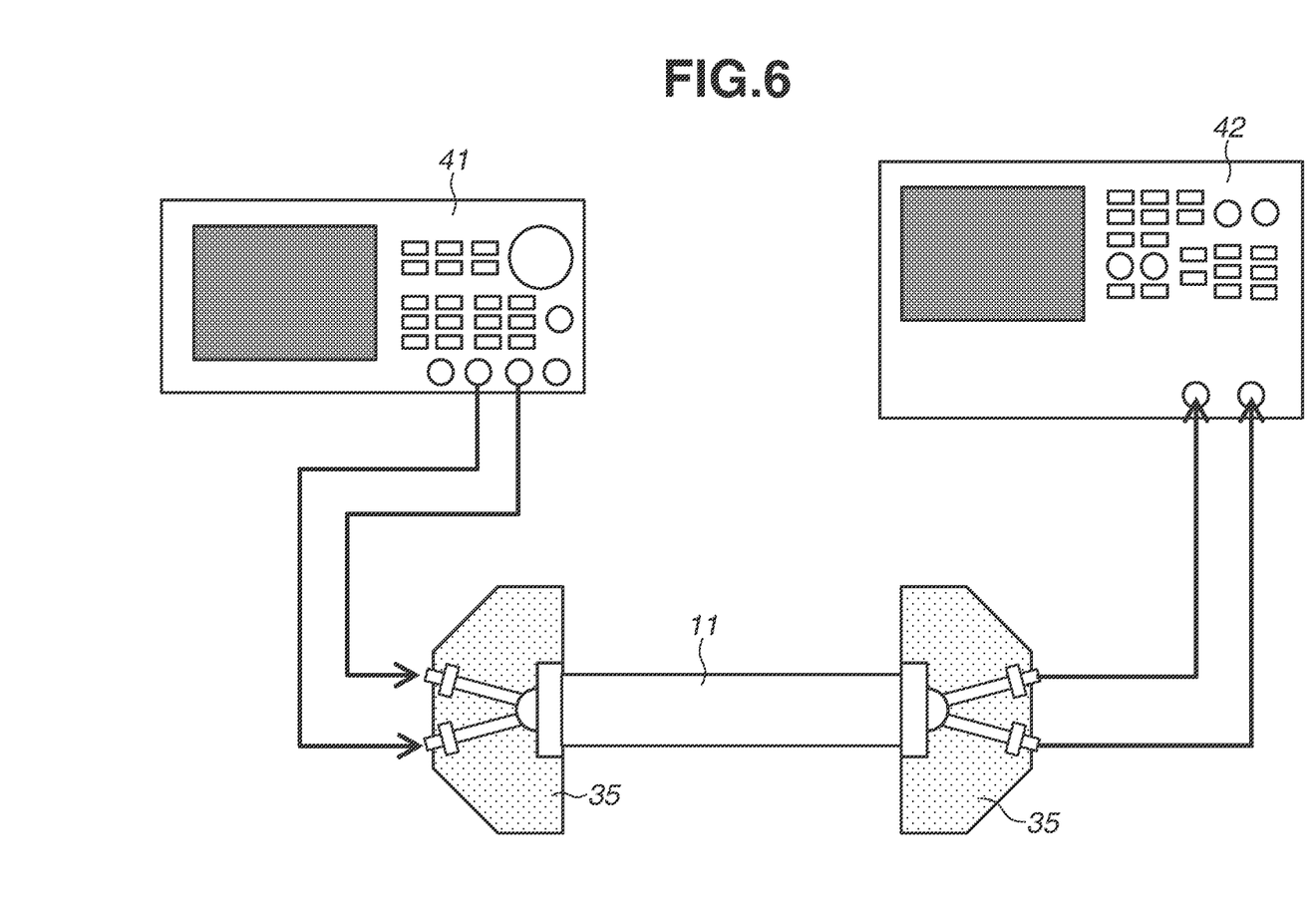
FIG. 6 is a diagram illustrating a system used for evaluation of a transmission characteristic according to the examples.

An output waveform characteristic of the wiring substrate was evaluated using a system including a configuration illustrated in FIG. 6.

The system included a signal generator 41 (M8041A manufactured by Agilent Technologies Japan, Ltd.), an oscilloscope 42 (92504A manufactured by Agilent Technologies Japan, Ltd.), and a pair of the connection substrates 35. The connection substrate 35 included an input terminal and an output terminal, and the flexible wiring board 11 as a measurement target was connected between the pair of the connection substrates 35 in a state in which the flexible wiring board 11 was floated in the air. Further, the signal generator 41 was connected to one of the connection substrates 35 to input a pseudo-random signal of PRBS23 having a bit rate of 5.3 Gbps. An amplitude of an input signal was 150 mV/side (differential 300 mV). Further, the other connection substrate 35 was connected to the oscilloscope 42, and an opening amplitude of signal eye pattern output from the connection substrate 35 was observed. The measurement was performed in an atmosphere having a temperature of 25° C. and a relative humidity of 30 to 50%. Evaluation criteria were as follows, and a rank B or higher was accepted.

A: an opening amplitude of 110 mV or more
B: an opening amplitude of 100 mV or more and less than 110 mV
C: an opening amplitude of less than 100 mV Examples 1 to 12

The flexible wiring board 11 having a shape as illustrated in FIG. 2B was produced.

A polyimide film (Kapton® 100H manufactured by DU PONT-TORAY CO., LTD.) having a thickness of 25 μm was prepared as the base member 12. A copper foil having a thickness of 12 μm was stacked as the wiring layer 13 over the first surface 12A of the base member 12, and the differential signal lines 13A and 13B having a total length of 120 mm were produced at a line width and a line interval indicated in Table 1 by the etching method.

Next, a copper foil having a thickness of 12 μm was stacked over the second surface 12B of the base member 12, and the ground layer 16 including the opening portion 21 including the openings and the non-opening portion 16A was formed in a configuration having numerical values indicated in Table 2 by the etching method. Inspection specifications of a circuit appearance and a tolerance were based on the Japan Electronics Packaging and Circuits Association (JPCA) standards (JPCA-DG02).

Next, the first insulating layer 14 and the second insulating layer 17 were formed over a wiring layer 13 and a ground layer 16, respectively. Specifically, the wiring substrates of the examples 1 to 12 were obtained by bonding a coverlay (CISV1215 manufactured by NIKKAN INDUSTRIES CO., LTD.) by a polyimide film having a thickness of 12.5 μm as an insulating portion and an adhesive portion having a thickness of 15 μm. The differential signal lines were designed to have a differential impedance of 100 Ω±10Ω as a target value. Table 2 indicates evaluation results of (1) radiation noise measurement and (2) transmission characteristic evaluation described above of the wiring substrates.

TABLE 1

| | Example | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| Line Width [μm] | 50 | 50 | 50 | 50 | 90 | 110 | 50 | 50 | 50 | 50 | 50 | 50 |
| Line Interval [μm] | 65 | 65 | 95 | 140 | 80 | 60 | 60 | 65 | 65 | 65 | 65 | 100 |

TABLE 2

| | | Example | | | | | | | | | | | |
|---|---|---|---|---|---|---|---|---|---|---|---|---|---|
| | | 1 | 2 | 3 | 4 | 5 | 6 | 7 | 8 | 9 | 10 | 11 | 12 |
| Opening | Shape (*1) | Rh | Re | Rh | Rh | Re | Re | Rh | Re | Re | E | H | Re |
| | L1 [μm] | 500 | 500 | 600 | 600 | 800 | 800 | 800 | 1500 | 1000 | 500 | 500 | 400 |
| | L2 [μm] | 100 | 100 | 120 | 120 | 180 | 180 | 190 | 180 | 50 | 100 | 100 | 100 |
| | L1/L2 | 5.0 | 5.0 | 5.0 | 5.0 | 4.4 | 4.4 | 4.2 | 8.3 | 20.0 | 5.0 | 5.0 | 4.0 |
| Distance Between Lines | L3 | 200 | 200 | 200 | 200 | 200 | 200 | 200 | 200 | 200 | 200 | 200 | 150 |
| Ground Layer | Opening Ratio [%] | 59 | 61 | 51 | 40 | 83 | 88 | 63 | 60 | 61 | 58 | 60 | 46 |
| Evaluation | Radiation Noise Amount [dBμV] | 18 | 19 | 19 | 17 | 21 | 24 | 20 | 24 | 20 | 21 | 18 | 22 |
| | Radiation Noise Measurement Result | A | A | A | A | B | B | B | B | B | B | A | B |
| | Opening Amplitude [mV] | 120 | 122 | 114 | 106 | 144 | 150 | 124 | 122 | 123 | 118 | 121 | 109 |
| | Transmission Characteristic Evaluation Result | A | A | A | B | A | A | A | A | A | A | A | B |

Note
(*1) The letter in the shape column indicates the following.
Rh: Rhombus, Re: Rectangle, E: ellipse, H: hexagon As indicated in Table 2, in all of the wiring substrates of the examples 1 to 12, the amounts of radiation noise at 5 GHz were small, and the opening amplitudes were all very good at the rank B or higher.

First to Fifth Comparative Examples

A wiring substrate having a layer configuration as illustrated in FIG. 2B was produced.

A polyimide film (Kapton® 100H manufactured by DU PONT-TORAY CO., LTD.) having a thickness of 25 μm was prepared as the base member. A copper foil having a thickness of 12 μm was stacked as the wiring layer over the first surface of the base member, and the first differential signal line and the second differential signal line having a total length of 120 mm were produced at a line width and a line interval indicated in Table 3 by the etching method.

Next, a copper foil having a thickness of 12 μm was stacked over the second surface of the base member, and the ground layer including the opening portion including the openings and the non-opening portion was formed in a configuration having numerical values indicated in Table 4 by the etching method. The inspection specifications of a circuit appearance and a tolerance were based on the JPCA standards (JPCA-DG02).

Next, the first insulating layer and the second insulating layer were formed over the wiring layer and the ground layer, respectively. Specifically, the wiring substrates of first to fifth comparative examples were obtained by bonding a coverlay (CISV1215 manufactured by NIKKAN INDUSTRIES CO., LTD.) by a polyimide film having a thickness of 12.5 µm as an insulating portion and an adhesive portion having a thickness of 15 µm. The differential signal lines were designed to have a differential impedance of 100 Ω±10Ω as a target value. Table 4 indicates evaluation results of (1) radiation noise measurement and (2) transmission characteristic evaluation described above of the wiring substrates.

TABLE 3

| | Comparative Example | | | | |
|---|---|---|---|---|---|
| | 1 | 2 | 3 | 4 | 5 |
| Line Width [µm] | 50 | 50 | 50 | 70 | 50 |
| Line Interval [µm] | 65 | 65 | 120 | 110 | 60 |

TABLE 4

| | | Comparative Example | | | | |
|---|---|---|---|---|---|---|
| | | 1 | 2 | 3 | 4 | 5 |
| Opening | Shape | Square | Square | Rhombus | Rhombus | Rectangle |
| | L1 [µm] | 300 | 100 | 300 | 800 | 840 |
| | L2 [µm] | 300 | 100 | 100 | 170 | 210 |
| | L1/L2 | 1.0 | 1.0 | 3.0 | 4.7 | 4.0 |
| Distance Between Lines | L3 | 200 | 200 | 200 | 150 | 200 |
| Ground Layer | Opening Ratio [%] | 59 | 59 | 43 | 67 | 63 |
| Evaluation | Radiation Noise Amount [dBµV] | 34 | 31 | 27 | 28 | 27 |
| | Radiation Noise Measurement Result | C | C | C | C | C |
| | Opening Amplitude [mV] | 112 | 112 | 107 | 127 | 122 |
| | Transmission Characteristic Evaluation Result | A | A | B | A | A |

Figure 7:
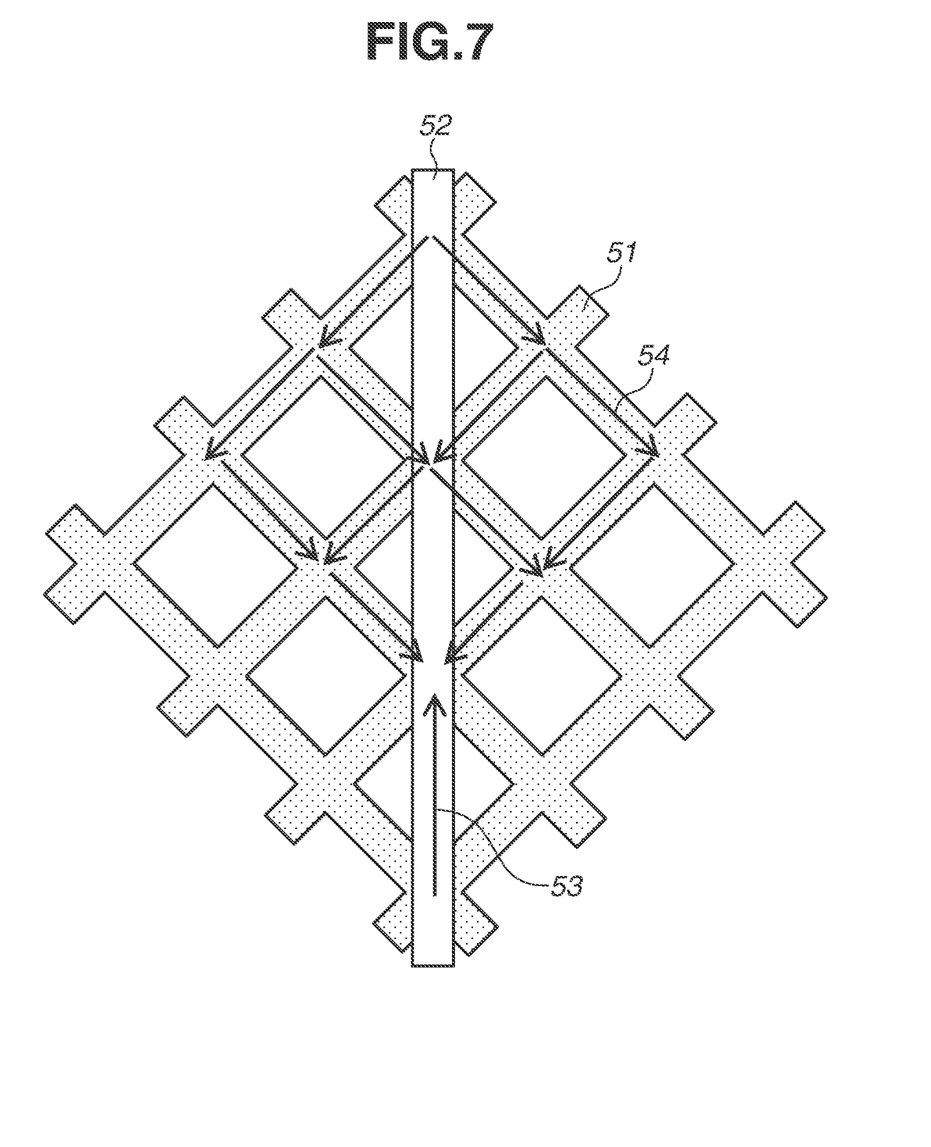
FIG. 7 is an explanatory diagram illustrating routes of a signal current and a return current on a wiring substrate according to a first comparative example.

The radiation noise was large in the first to the third comparative examples in which the length L1 was less than four times of the length L2. FIG. 7 illustrates the wiring substrate of the first comparative example. As illustrated in FIG. 7, in the wiring substrate of the first comparative example, a route of a return current 54 flowing through a ground layer 51 with respect to that of a signal current 53 flowing through a transmission line 52 is longer than those in the examples 1 to 12 in which the length L1 is four times or more of the length L2. Therefore, it can be considered that the wiring substrate of the first comparative example could not sufficiently exert a suppression effect on an increase of the radiation noise due to an increase of a speed of a transmission signal.

Figure 8:
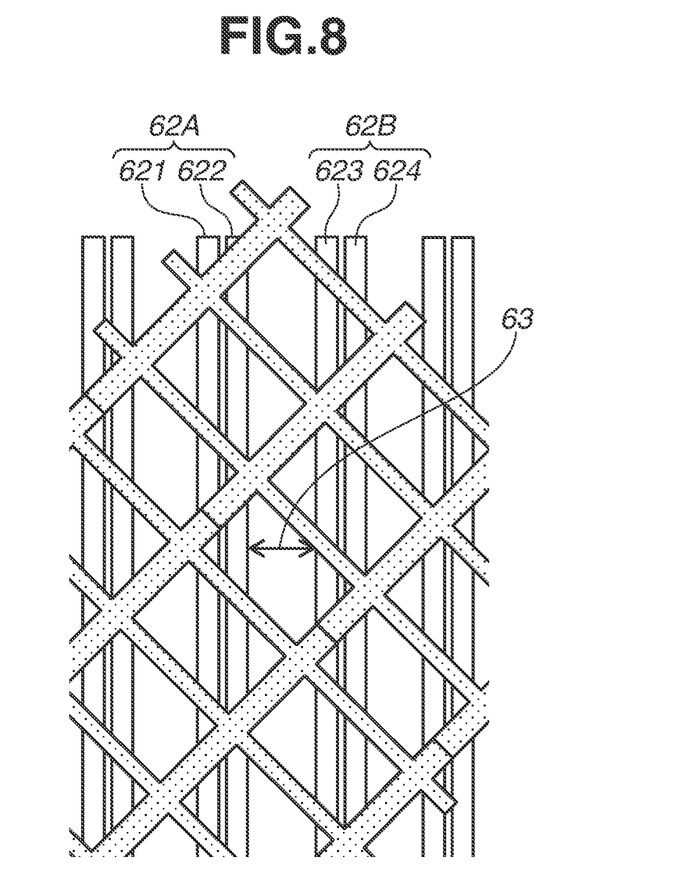
FIG. 8 is an explanatory diagram illustrating a positional relationship of a ground layer and differential signal lines according to the first comparative example.

The radiation noise was also large in the fourth and the fifth comparative examples in which the length L2 was longer than the length L3. FIG. 8 illustrates the wiring substrate of the fifth comparative example. As illustrated in FIG. 8, in the wiring substrate of the fifth comparative example, an area 63 in which the ground layer does not exist between a differential transmission line 62A and a differential transmission line 62B is larger than those in the examples 1 to 12 in which the length L2 is the length L3 or less. Therefore, it can be considered that crosstalk between signal lines 622 and 623 became larger, and the radiation noise increased. Therefore, it can be considered that the wiring substrate of the fifth comparative example could not sufficiently exert the suppression effect on an increase of the radiation noise due to an increase of a speed of a transmission signal.

As described above, the present disclosure can provide a wiring substrate which generates less radiation noise and less crosstalk noise in transmission of a high-speed data signal. Further, the present disclosure can provide an electronic device including the wiring substrate.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of priority from Japanese Patent Application No. 2019-224921, filed Dec. 12, 2019, which is hereby incorporated by reference herein in its entirety.

What is claimed is:

1. A wiring substrate comprising:
a base member having a first surface;
a first differential signal line including a first pair of signal lines disposed on the first surface of the base member;
a second differential signal line including a second pair of signal lines disposed adjacent to the first differential signal line on the first surface of the base member; and
a ground layer arranged on a plane spaced apart from the first differential signal line and the second differential signal line and having an opening portion including a plurality of openings each continuously arranged along a predetermined direction,
wherein in a planar view of the wiring substrate, where a length of each of the plurality of openings in a direction along the first and second pair of signal lines is a length L1, a length of the opening in a direction orthogonal to a length direction of the length L1 is a length L2, and a distance between the first differential signal line and the second differential signal line is a length L3, the length L1 is greater than or equal to four times the length L2, and the length L2 is equal to or less than the length L3.

2. The wiring substrate according to claim 1, wherein in a planar view of the wiring substrate, an area ratio of the opening portion in the ground layer is in a range of 40% or more and 90% or less.

3. The wiring substrate according claim 1, wherein the length L1 is 1.5 mm or less.

4. The wiring substrate according claim 1, wherein each shape of the plurality of openings is any of a rhombus, a rectangle, a hexagon, and an ellipse.

5. The wiring substrate according to claim 1, wherein a thickness of the ground layer is in a range of 1 µm or more and 20 µm or less.

6. The wiring substrate according to claim 1, wherein the base member is made of a resin.

7. The wiring substrate according to claim 1,
wherein the base member has a second surface which is opposite to the first surface, and
wherein the ground layer is disposed on the second surface.

8. The wiring substrate according to claim 7, further comprising a first insulating layer, wherein the base member, the first differential signal line and the second differential signal line are arranged between the ground layer and the first insulating layer.

9. The wiring substrate according to claim 8, wherein the first insulating layer includes a first adhesive portion and a first covering portion, and a volume resistance value of the first covering portion is $10^9$ Ω·cm or more.

10. The wiring substrate according to claim 8, further comprising a second insulating layer, wherein the ground layer is arranged between the base member and the second insulating layer.

11. The wiring substrate according to claim 10, wherein when a signal having a bit rate of 5.3 Gbps and an amplitude of 150 mV/side is transmitted to the wiring substrate, an opening amplitude in an atmosphere at a temperature of 25° C. and a relative humidity of 23 to 50% is 110 mV or more.

12. The wiring substrate according to claim 8, wherein the second insulating layer includes a second adhesive portion and a second covering portion, and a volume resistance value of the second covering portion is $10^9$ Ω·cm or more.

13. The wiring substrate according to claim 1,
wherein the wiring substrate includes an insulating layer over the first differential signal line and the second differential signal line, and
wherein the ground layer is disposed over the insulating layer.

14. The wiring substrate according to claim 1, wherein each of the first differential signal line and the second differential signal line serves as a connection between a first semiconductor device and a second semiconductor device.

15. The wiring substrate according to claim 14, wherein a signal that is transmitted via the first differential signal line and the second differential signal line is a digital signal having a transmission speed of 5 gigabits per second (Gbps) or more.

16. The wiring substrate according to claim 14,
wherein the first semiconductor device is an image capturing element, and
wherein the second semiconductor device is a processing circuit configured to process a signal transmitted from the image capturing element.

17. An electronic device comprising:
the wiring substrate according to claim 1; and
a housing storing the wiring substrate therein.

18. The electronic device according to claim 17,
wherein the housing further stores a wireless communication unit configured to wirelessly communicate with an external device, and
wherein the ground layer of the wiring substrate is arranged at a position closer to the wireless communication unit than the first differential signal line and the second differential signal line of the wiring substrate in the housing.

19. A wiring substrate comprising:
a base member having a first surface;
a first differential signal line including a first pair of signal lines disposed on the first surface of the base member;
a second differential signal line including a second pair of signal lines disposed adjacent to the first differential signal line on the first surface of the base member; and
a ground layer arranged on a plane spaced apart from the first differential signal line and the second differential signal line and having an opening portion including a plurality of openings each continuously arranged along a predetermined direction,
wherein in a planar view of the wiring substrate, where a length of each of the plurality of openings in a direction along the first and second pair of signal lines is a length L1, a length of the opening in a direction orthogonal to a length direction of the length L1 is a length L2, and a distance between the first differential signal line and the second differential signal line is a length L3, the length L1 is greater than the length L2, and the length L2 is equal to or less than the length L3, and
wherein when a signal having a bit rate of 5.3 Gbps is transmitted to the wiring substrate, a radiation noise measured in a frequency range from 300 kHz to 20 GHz in an atmosphere at a temperature of 25° C. and a relative humidity of 23 to 50% is less than 20 dbµV.

* * * * *